United States Patent
Tsubota et al.

(10) Patent No.: US 7,920,079 B2
(45) Date of Patent: Apr. 5, 2011

(54) SERIAL SIGNAL RECEIVING DEVICE, SERIAL TRANSMISSION SYSTEM AND SERIAL TRANSMISSION METHOD

(75) Inventors: Hirokazu Tsubota, Ebina (JP); Toshio Hisamura, Ebina (JP); Atsushi Ugajin, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 55 days.

(21) Appl. No.: 12/433,379

(22) Filed: Apr. 30, 2009

(65) Prior Publication Data

US 2010/0097249 A1   Apr. 22, 2010

(30) Foreign Application Priority Data

Oct. 17, 2008   (JP) .................................. 2008-268243

(51) Int. Cl.
*H03M 9/00* (2006.01)
(52) U.S. Cl. ........................................ 341/100; 341/101
(58) Field of Classification Search .................. 341/100, 341/101
See application file for complete search history.

(56) References Cited

U.S. PATENT DOCUMENTS

| | | | |
|---|---|---|---|
| 4,932,024 A * | 6/1990 | Bonicioli et al. | 370/458 |
| 2005/0134538 A1* | 6/2005 | Aoki | 345/87 |
| 2005/0259775 A1 | 11/2005 | Chang | |
| 2006/0133540 A1 | 6/2006 | Eglit | |
| 2007/0229320 A1* | 10/2007 | Bae et al. | 341/50 |

FOREIGN PATENT DOCUMENTS

| | | |
|---|---|---|
| JP | 05-037510 A | 2/1993 |
| JP | 2005-333649 A | 12/2005 |
| JP | 2006-203866 A | 8/2006 |

* cited by examiner

*Primary Examiner* — Jean B Jeanglaude
(74) *Attorney, Agent, or Firm* — Sughrue Mion, PLLC

(57) ABSTRACT

A serial signal receiving device, includes: a serial-parallel converter that converts a transmitted serial signal into a parallel signal, wherein the serialized signal is obtained by the plural signal; a storage unit that stores phase difference information indicating a phase difference among the plural signals; and a correcting unit that corrects a phase relation among the plural signals of the parallel signal output from the serial-parallel converter based on the phase difference information stored by the storage unit.

15 Claims, 6 Drawing Sheets

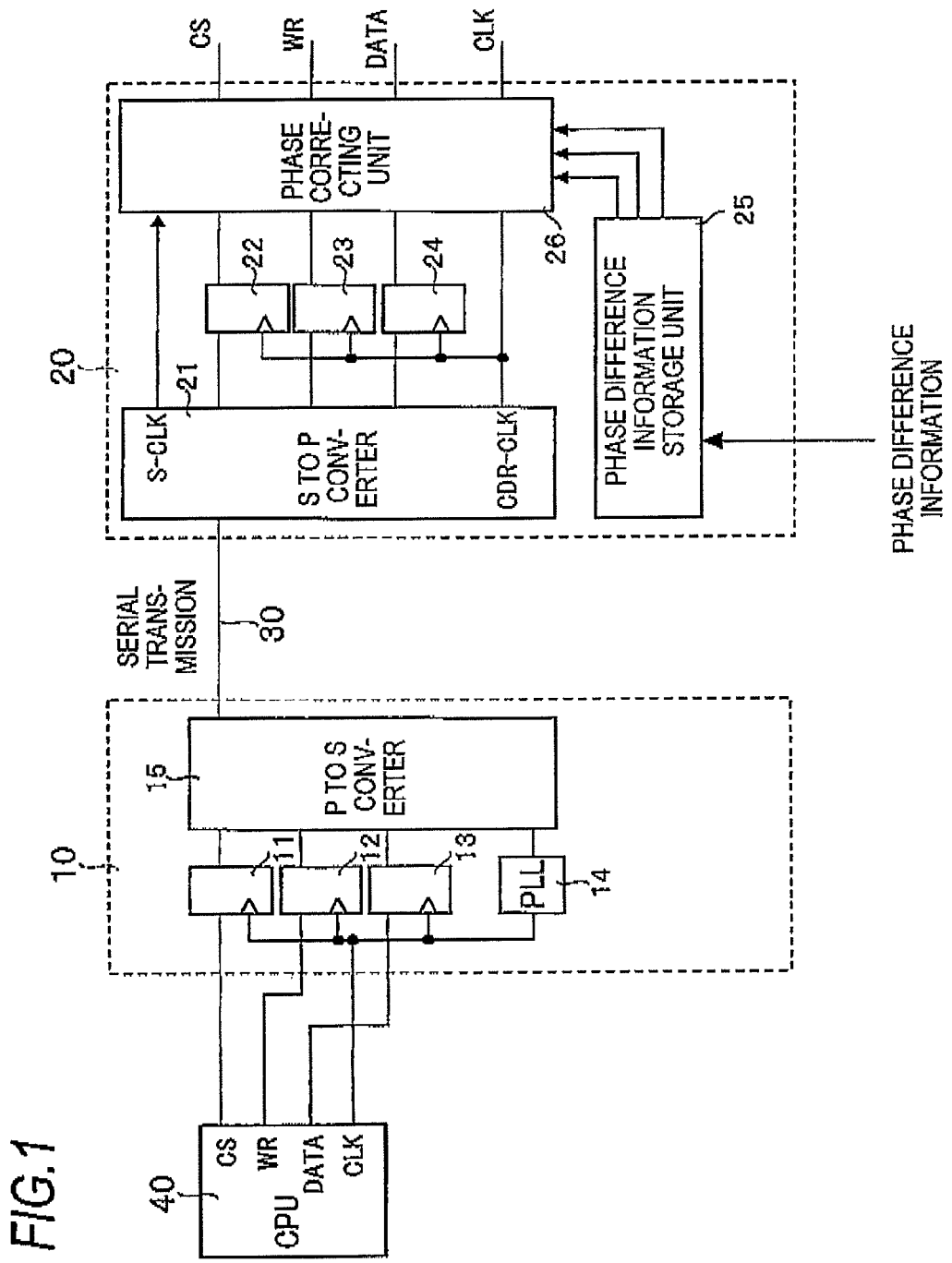

K27.7 INDICATES START OF PACKET AND IS GENERATED AT ARBITRARY PACKET START TIMING
K29.7 INDICATES END OF PACKET AND IS GENERATED IN ACCORDANCE WITH STANDARD WIDTH
K28.1 AND K28.2 ARE USED FOR COMMANDS

SERIAL SIGNAL RECEIVING DEVICE, SERIAL TRANSMISSION SYSTEM AND SERIAL TRANSMISSION METHOD

CROSS-REFERENCE TO RELATED APPLICATIONS

This application is based on and claims priority under 35 USC 119 from Japanese Patent Application No. 2008-268243 filed Oct. 17, 2008.

BACKGROUND

1. Technical Field

The present invention relates to a serial signal receiving device, a serial transmission system and a serial transmission method.

2. Related Art

As information transmitting technologies, a serial transmission technology and a parallel transmission technology are known. In the serial transmission technology, information is transmitted in order (serially) bit by bit (minimum unit of information) through a communication line. In the parallel transmission technology, information is transmitted at once in parallel bits by bits through plural communication lines.

Recently, transmission of information using the serial transmission (serial transfer) technology, particularly a high-speed serial transmission technology of G-bit/s, for example, 2.5 G-bit/s and more has been frequently performed. This is because the transmission amount of information is increasing as functions of an equipment (device) dealing with information becomes higher and image quality becomes higher.

In case of information transmission using the parallel transmission technology, as the transmission amount of information becomes larger, the number of transmission lines increases and the area occupied physically by the transmission lines increases.

Usually, under the configuration of a serial transmission system, in order to serialize plural signals input in parallel on the transmission side, the plural signals are sampled and latched in synchronization with a sampling clock, and the respective latched signals are transmitted serially by a transmission clock of which speed is higher than the speed of the sampling clock.

SUMMARY

According to an aspect of the invention, a serial signal receiving device, includes: a serial-parallel converter that converts a transmitted serial signal into a parallel signal, wherein the serialized signal is obtained by the plural signal; a storage unit that stores phase difference information indicating a phase difference among the plural signals; and a correcting unit that corrects a phase relation among the plural signals of the parallel signal output from the serial-parallel converter based on the phase difference information stored by the storage unit.

BRIEF DESCRIPTION OF THE DRAWINGS

Exemplary embodiment(s) of the present invention will be described in detail based on the following figures, wherein:

FIG. 1 is a system configuration diagram showing an outline of a configuration of a serial transmission system according to a first exemplary embodiment of the invention;

DETAILED DESCRIPTION

Figure 2A:
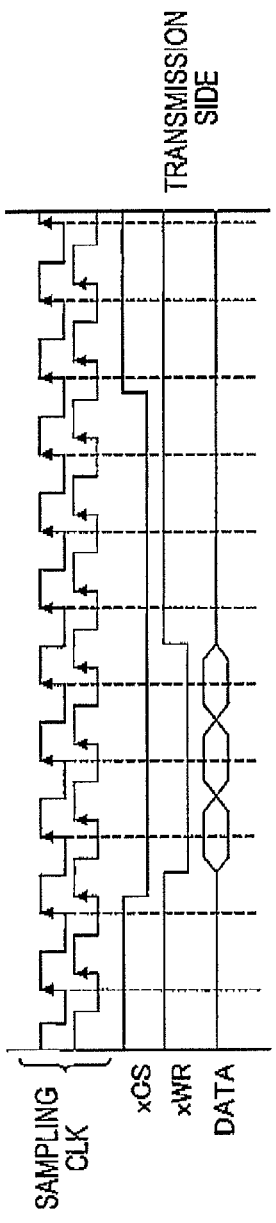
FIG. 2A, FIG. 2B and FIG. 2C are timing charts for explaining the operation of the serial transmission system according to the first exemplary embodiment.

Exemplary embodiments of the invention will be described below in detail with reference to drawings.

First Exemplary Embodiment

Configuration of System

FIG. 1 is a system configuration diagram showing an outline of a configuration of a serial transmission system according to a first exemplary embodiment of the invention. The serial transmission system according to the first exemplary embodiment includes a transmission device 10 and a reception device 20, and the transmission device 10 and the reception device 20 are electrically connected to each other through a communication line (transmission line) 30.

To the transmission device 10, plural signals are input in parallel from a CPU 40 as an information processing unit. Further, a periodic signal, that is, a clock signal CLK which is generated periodically is input as a system clock to the transmission device 10.

Herein, as an example of the plural signals, a chip selection signal CS, a writing signal WR, and an information signal DATA are taken. However, this is merely an example, and the invention is not limited to this. As other signals, when the information signal DATA is pixel information, a line synchronous signal for defining a line, a page synchronous signal for defining a page, and the like are taken.

Here, the chip selection signal CS is a signal for specifying which device (chip) of plural input/output interface devices processing is performed for. The writing signal WR is a signal for instructing the chip selected by the chip selection signal CS to write the information signal DATA.

The transmission device 10 includes three latch circuits 11, 12 and 13 provided correspondingly to the number of signals input in parallel from the CPU 40, a clock generating unit for generating a transmission clock which will be described later, and a P to S converter 15. As the clock generating unit, for example, a PLL (Phase Locked Loop) circuit is used. Further, P of the P to S converter 15 indicates a parallel signal, and S thereof indicates a serial signal.

The latch circuit 11, with a chip selection signal CS as an input signal, latches the chip selection signal CS in synchronization with the clock signal CLK. The latch circuit 12, with a writing signal WR as an input signal, latches the writing signal WR in synchronization with the clock signal CLK. The latch circuit 13, with an information signal DATA as an input signal, latches the information signal DATA in synchronization with the clock signal CLK.

Namely, the chip selection signal CS, the writing signal WR and the information signal DATA are incorporated into the transmission device 10 by the same clock signal CLK and latched to the latch circuits 11, 12 and 13, respectively. Accordingly, the clock signal CLK becomes a sampling clock for incorporating the chip selection signal CS, the writing signal WR and the information signal DATA at the same timing.

The PLL circuit 14 generates, by frequency-multiplying the clock signal CLK that is the sampling clock, a transmission clock which is higher in frequency than the clock signal CLK. This generated transmission clock is supplied to the P to S converter 15.

The P to S converter 15 serializes the chip selection signal CS, the writing signal WR and the information signal DATA latched by the latch circuits 11, 12 and 13 in synchronization with the transmission clock generated by the PLL circuit 14, bit by bit in order. At this time, a serial signal includes also transmission clock information. The serial signal including this transmission clock information is transmitted through the communication line 30 to the reception device 20.

The reception device 20 includes an S to P converter 21, three latch circuits 22, 23 and 24, a phase difference information storage unit 25, and a phase correcting unit 26.

The S to P converter 21 receives the serial signal transmitted serially through the communication line 30 from the transmission device 10, and extracts the transmission clock information inserted in the serial signal as a control clock S-CLK. Next, the S to P converter 21 supplies the extracted control clock S-CLK to the phase correcting unit 26, and converts the received serial signal S into a parallel signal P in synchronization with the control clock S-CLK.

The S to P converter 21 further generates, on the basis of the control clock S-CLK, a latch clock CDR-CLK having the same frequency as the frequency of the sampling clock CLK of the transmission side, and supplies the latch clock CDR-CLK to the latch circuits 22, 23 and 24, and the phase correcting unit 26.

The latch circuits 22, 23 and 24 respectively latch the chip selection signal CS, the writing signal WR and the information signal DATA output in parallel from the S to P converter 21, in synchronization with the latch clock CDR-CLK. Hereby, the chip selection signal CS, the writing signal WR and the information signal DATA are output from the latch circuits 22, 23 and 24 at the same timing, and supplied to the phase correcting unit 26.

The phase difference information storage unit 25 stores in advance phase difference information as correction information. The phase difference information indicates phase difference among the plural signals input in parallel from the CPU 40 to the transmission device 10, that is, among the chip selection signal CS, the writing signal WR and the information signal DATA. This phase difference refers to time lag among a logical change point of the chip selection signal CS (change point from the logic 0 (low voltage) to the logic 1 (high voltage) or from the logic 1 to the logic 0), a logical change point of the writing signal WR, and a first information start point of the information signal DATA (this can be taken also as a change point).

Here, when the chip selection signal CS, the writing signal WR and the information signal DATA are compared with one another, due to the before-mentioned properties of the functions of these signals, the logical change point of the chip selection signal CS comes earlier than the logical change point of the writing signal WA and the first information start point of the information signal DATA.

Therefore, in this example, on the basis of the logical change point of the chip selection signal CS, time lag between the logical change point of the writing signal WR and the change point of this base signal, and time lag between the first information start point of the information signal DATA and the change point of the base signal are taken as the phase difference among the plural signals. This phase difference, since it is time information, can be represented by the number of count (the number of clock cycles) of the control clock S-SLK having a constant cycle. The control clock S-CLK has the same frequency as the frequency of the transmission clock on the transmission side.

Here, as an example, other two signals than the base signal have the same phases are given. That is, phase difference information among the three signals is one. However, this is merely an example, and there is also a case in which other two signals than the base signal have the different phases. In this case, as phase difference information among the three signals, there are two between the two remaining signals and the base signal.

On the transmission side, the phase difference among the plural signals input in parallel from the CPU 40 to the transmission device 10 has been determined under specifications. Accordingly, by converting the phase difference to the number of clock cycles of the control clocks S-CLK, the phase difference information among the plural signals can be obtained as the number of clock cycles. This clock number information is stored in advance in the phase difference information storage unit 25 as phase difference information indicating the phase relation among the plural signals when their signals have been input in parallel to the transmission device 10.

The phase correcting unit 26 subjects the chip selection signal CS, the writing signal WR and the information signal DATA which are supplied from the S to P converter 21 through the latch circuits 22, 23 and 24 at the same timing to phase correction processing, using the phase difference information given from the phase difference information storage unit 25 as correction information. This phase correction processing is performed on the basis of the correction information in order to return a phase relation among their signals to the phase relation when their signals have been input in parallel to the transmission device 10.

Specifically, in this example, on the basis of the chip selection signal CS, after the chip selection signal CS has been output, the control clock S-CLK is counted to the number of clock cycles by the phase difference information given from the phase difference information storage unit 25, that is, and the output of the writing signal WR and the output of the information signal DATA are delayed respectively for the time according to the number of clock cycles. Herein, the logical change point of the writing signal WR and the first information start point of the information signal DATA have the same timing.

Thereafter, the phase correcting unit 26 outputs the chip selection signal CS, the writing signal WR and the information signal DATA in a state where the phase relation among their signals returns to the phase relation when their signals have been input in parallel from the CPU 40 to the transmission device 10. Further, the phase correcting unit 26 frequency-divides the control clock S-CLK thereby to output a clock signal CLK having the same cycle as the cycle of the sampling clock CLK on the transmission side, Operation of System Next, the operation of the serial transmission system having the above configuration according to the first exemplary embodiment will be described with reference to timing charts of FIGS. 2A to 2C. In the timing charts of FIGS. 2A to 2C, reverse signals of the chip selection signal CS and the writing signal WR, that is, a reverse chip selection signal xCS and a reverse writing signal xWR are shown.

As clear from FIGS. 2A to 2C, the phase relation among the chip selection signal xCS (CS), the writing signal xWR (WR) and the information signal DATA, that is, the phase difference among their change points is below the sampling cycle on the transmission side, that is, below the cycle of the sampling clock CLK. Under such the phase relation, as described before, the signal sampling interval by the sampling clock CLK becomes coarser than the cycle between the change points, so that the problem that the phase relation among the plural signals input in parallel alters is produced.

First, on the transmission side, from the CPU 40 to the transmission device 10, as shown in FIG. 2A, the chip selection signal CS, the writing signal WR and the information signal DATA which have the phase relations determined in advance under specifications are input in parallel together with the sampling clock CLK.

This parallel signal, after being converted into a serial signal (serialized) by the transmission device 10, is serially transmitted through the communication line 30 to the reception side. Then, the serial signal S is converted into a parallel signal P (parallelized) by the S to P converter 21 of the reception device 20.

Figure 2B:
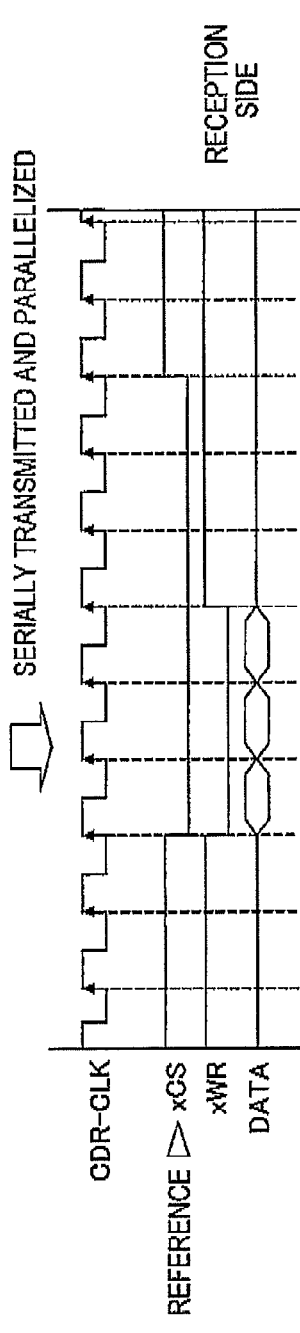

At this time, the reverse chip selection signal xCS, the reverse writing signal xWR and the information signal DATA which are output in parallel from the S to P converter 21 are latched respectively to the latch circuits 22, 23 and 24 in synchronization with rising timing of the control clock CDR-CLK, Therefore, as shown in FIG. 2B, the logic change point of the reverse chip selection signal xCS, the logic change point of the reverse writing signal xWR and the first information start point of the information signal DATA are in phase.

For the reverse chip selection signal xCS, the reverse writing signal xWR and the information signal DATA which are in phase, the phase correcting unit 26 performs the phase correction processing for returning the phase relation among their signals to the phase relation when their signals have been input from the CPU 40 to the transmission device 10 in parallel. Specifically, with the reverse chip selection signal sCS as a base signal, on the basis of the phase difference information given from the phase difference information storage unit 25, the reverse writing signal xWR and the information signal DATA are shifted from the base signal by a defined value.

Figure 2C:
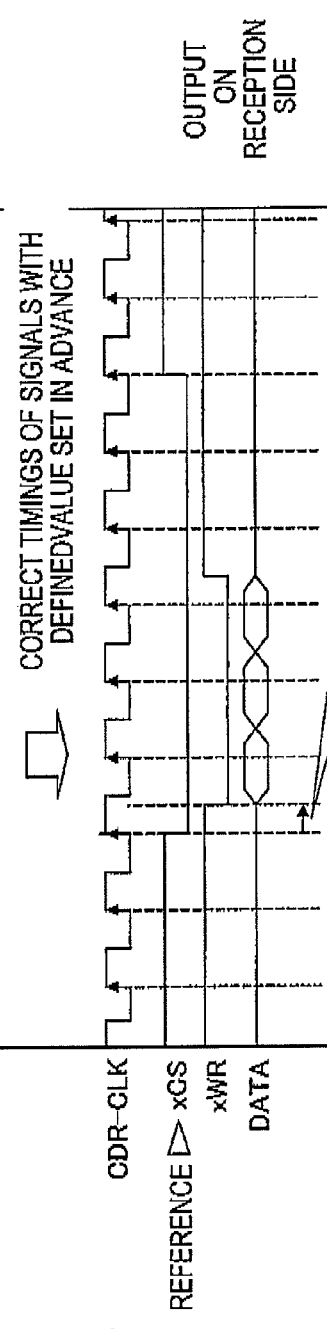

Due to the phase correction by this phase correction unit 26, the reverse chip selection signal xCS, the reverse writing signal xWR and the information signal DATA, when output from the reception side, as shown in FIG. 2C, is supplied through the transmission line to the sequential device in a state where the phase relation when their signals have been input from the CPU 40 to the transmission device 10 in parallel is kept.

The chip selection signal CS (xCS), the writing signal WR (xWR) and the information signal DATA, since they keep the phase relation in the parallel input time, are transmitted to the sequential device without the reverse phase relation, even in case that propagation delay is produced due to difference in wiring length of the transmission wire between the reception device 20 and the sequential device.

Second Exemplary Embodiment

Configuration of System

Figure 3:
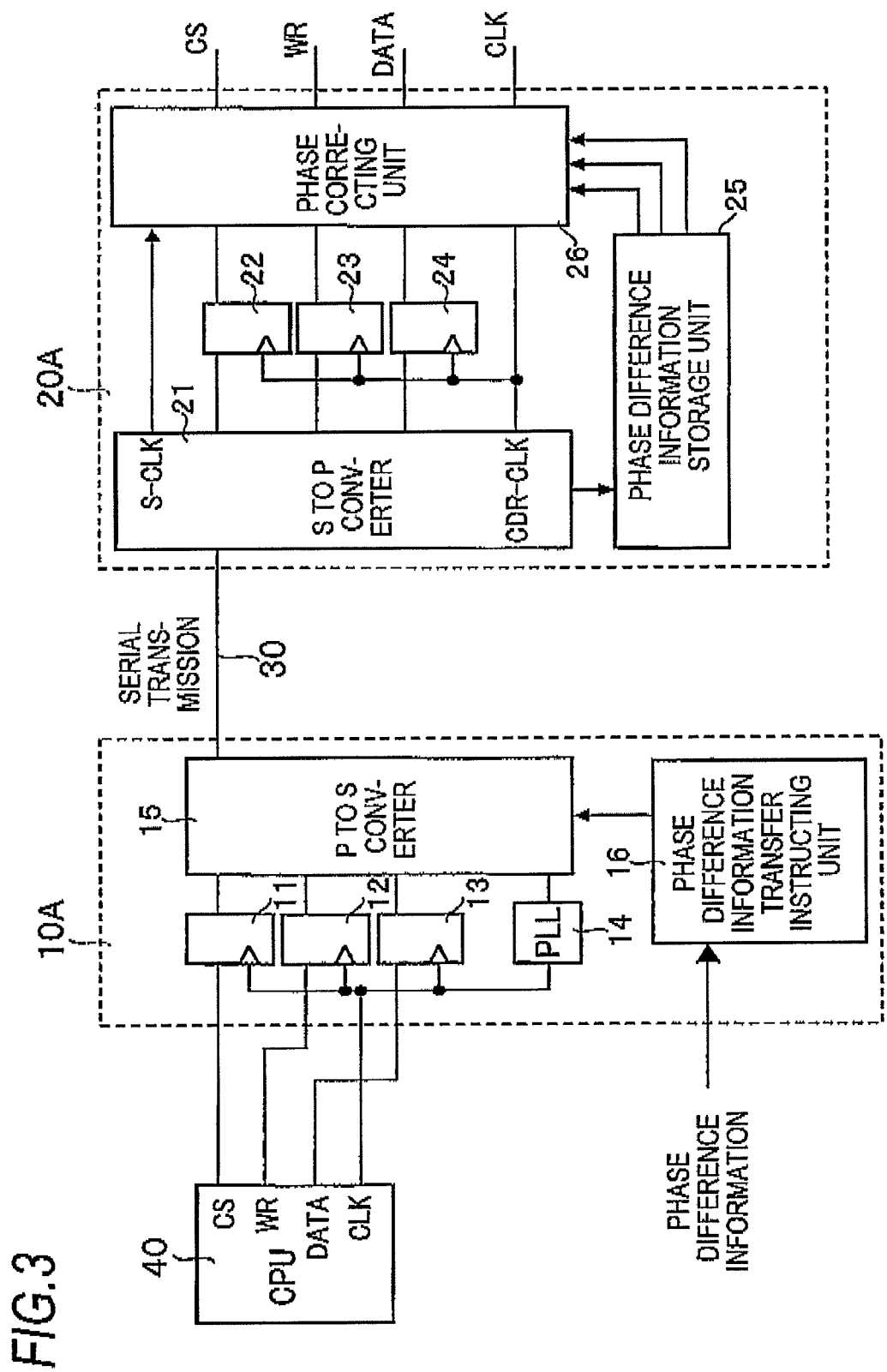
FIG. 3 is a system configuration diagram showing an outline of a configuration of a serial transmission system according to a second exemplary embodiment of the invention.

FIG. 3 is a system configuration diagram showing an outline of a configuration of a serial transmission system according to a second exemplary embodiment of the invention. In the figure, units equal to those in FIG. 1 are denoted by the same symbols. The serial transmission system according to the second exemplary embodiment includes a transmission device 10A and a reception device 20A, and the transmission device 10A and the reception device 20A are electrically connected to each other through a communication line 30.

To the transmission device 10A, plural signals are input in parallel from a CPU 40 as a signal source. Herein, as an example of the plural signals, a chip selection signal CS, a writing signal WR, and an information signal DATA are taken, but this is merely an example. To the transmission device 10A, from the CPU 40, further, a clock signal CLK generated periodically is also input.

The transmission device 10A has, similarly to the transmission device 10 according to the first exemplary embodiment, in addition to a function of converting plural signals (parallel signal) input from the CPU 40 in parallel into a serial signal and performing serial transmission, a function of inserting phase difference information representing phase difference among the plural signals input in parallel from the CPU 40 to the transmission device 10A in the serial signal and performing the serial transmission.

More specifically, the transmission device 10A includes, in addition to three latch circuits 11, 12 and 13, a PLL circuit 14 and a P to S converter 15, a phase difference information transfer instructing unit 16. Herein, also, as an example of the plural signals, three signals of a chip selection signal CS, a writing signal WR and information signal DATA are taken. However, this is merely an example, and the invention is not limited to this.

Similarly to the case in the first exemplary embodiment, the latch circuits 11, 12 and 13 latch, in synchronization with a sampling clock CLK, the chip selection signal CS, the writing signal WR and the information signal DATA which are input in parallel from the CPU 40. The PLL circuit 14 generates, by frequency-multiplying the sampling clock CLK, generates a transmission clock which is higher in frequency than the clock CLK.

To the phase difference information transfer instructing unit 16, phase difference information is given. The phase difference information indicates a phase difference among the plural signals input in parallel from the CPU 40 to the transmission device 10A, that is, among the chip selection signal CS, the writing signal WR and the information signal DATA. This phase difference, as described before, refers to time lag among a logical change point of the chip selection signal CS, a logical change point of the writing signal WR, and a first information start point of the information signal DATA.

In this example, on the basis of the logical change point of the chip selection signal CS, time lag between the logical change point of the writing signal WR and the change point of this base signal, and time lag of the first information start point of the information signal DATA and the change point of the base signal are taken as the phase difference among the plural signals. This phase difference, since it is time information, can be represented by the number of clock cycles of the transmission clock obtained by frequency-multiplying the sampling clock CLK in the PLL circuit 14.

The phase difference among the plural signals input in parallel from the CPU 40 to the transmission device 10A has been determined under specifications. Accordingly, by converting the phase difference to the number of clock cycles of the transmission clock, the phase difference information among the plural signals can be obtained by the number of clock cycles. This clock number information is given to the phase difference information transfer instructing unit 16 as phase difference information indicating the phase relation among the plural signals when their signals have been input in parallel to the transmission device 10A.

The phase difference information transfer instructing unit 16 stores the phase difference information (clock number information) given from the outside, and gives the phase difference information to the P to S converter 15 as command data when the P to S converter 15 converts the parallel signal into a serial signal and transmits the serial signal. Upon reception of this command data, the P to S converter 15 inserts the command data into the serial signal and transmits its serial signal serially to the reception device 20A. A concrete example of inserting the command data indicating the phase difference information into the serial signal and performing the serial transmission will be described later.

The reception device 20A includes, similarly to the reception device 20 in the first exemplary embodiment, an S-P converter 21, three latch circuits 22, 23 and 24, a phase difference information storage unit 25, and a phase correcting unit 26. However, the phase difference information storage unit 25 in the first exemplary embodiment stores in advance the phase different information given from the outside. To the contrary, the phase difference information storage unit 25 in the reception device 20A in this exemplary embodiment stores, as phase difference information, the command data extracted from the serial signal received by the S to P converter 21

Similarly to the case in the first exemplary embodiment, the S to P converter 21 receives the serial signal transmitted serially through the communication line 30 from the transmission device 10A, and extracts the transmission clock information inserted in the serial signal as a control clock S-CLK. Then, the S to P converter 21 supplies the extracted control clock S-CLK to the phase correcting unit 26, and converts the received serial signal S into a parallel signal P in synchronization with the control clock S-CLK.

The S to P converter 21 further extracts the command data inserted into the serial signal and gives the extracted command data to the phase difference information storage unit 25. Further, the S to P converter 21 generates, on the basis of the control clock S-CLK, a latch clock CDR-CLK having the same frequency as the frequency of the sampling clock CLK on the transmission side, and supplies the latch clock CDR-CLK to the latch circuits 22, 23 and 24, and the phase correcting unit 26.

The latch circuits 22, 23 and 24 latch the chip selection signal CS, the writing signal WR and the information signal DATA output in parallel from the S to P converter 21, in synchronization with the latch clock CDR-CLK. Hereby, the chip selection signal CS, the writing signal WR and the information signal DATA are output from the latch circuits 22, 23 and 24 at the same timing, and supplied to the phase correcting unit 26.

The phase correcting unit 26 subjects the chip selection signal CS, the writing signal WR and the information signal DATA which are supplied from the S to P converter 21 through the latch circuits 22, 23 and 24 at the same timing to phase correction processing. This phase correction processing is performed on the basis of the phase difference information given from the phase difference information storage unit 25 in order to return a phase relation among their signals to the phase relation when their signals have been input in parallel to the transmission device 10A.

Specifically, in this example, on the basis of the chip selection signal CS, after the chip selection signal CS has been output, the control clock S-CLK is counted to the number of clock cycles by the phase difference information given from the phase difference information storage unit 25, that is, and the output of the writing signal WR and the output of the information signal DATA are delayed respectively for the time according to the number of clock cycles. Herein, also, similarly to the case in the first exemplary embodiment, the logical change point of the writing signal WR and the first information start point of the information signal DATA have the same timing.

The control clock S-CLK is a clock having the same cycle as the cycle of the transmission clock used on the transmission side. Namely, the phase difference information set as the number of clock cycles of the transmission clock represents the number of clock cycles of the control clock S-CLK. Accordingly, by counting the control clock S-CLK, the phase correction can be performed according to the delay time determined by its number of clock cycles.

Thereafter, the phase correcting unit 26 outputs the chip selection signal CS, the writing signal WR and the information signal DATA in a state where the phase relation among their signals returns to the phase relation when their signals have been input in parallel from the CPU 40 to the transmission device 10. Further, the phase correcting unit 26 frequency-divides the control clock S-CLK thereby to output a clock signal CLK having the same cycle as the cycle of the sampling clock CLK on the transmission side.

Operation of System

The operation of the above configured serial transmission system according to the second exemplary embodiment is basically the same as the operation of the serial transmission system according to the first exemplary embodiment. The difference between the first exemplary embodiment and the second exemplary embodiment is the following point. Namely, in case of the serial transmission system according to the first exemplary embodiment, the phase correction is performed on the basis of the phase difference information stored in advance by the phase difference information storage unit 25. To the contrary, in case of the serial transmission system according to the second exemplary embodiment, the phase difference information is inserted as the command data into the serial signal and transmitted serially from the transmission side, and the phase correction is performed on the reception side on the basis of the phase difference information obtained from the command data.

Here, in case of a serial transmission system in which the frequency of the transmission clock and the phase relation among the plural signals are constant regardless of information to be transmitted, when the phase correction is performed on the reception side, the phase correction processing does not need to be performed using the phase difference information extracted from the serial signal at every reception and the phase correction processing can be also performed using the phase difference information stored in advance in the phase difference information storage unit 25.

However, there is also a serial transmission system in which the frequency of the transmission clock and the phase relation among the plural signals change due to the difference in contents of information to be transmitted. As an example of this serial transmission system, when information to be transmitted is image information, there is a case in which the frequency of the transmission clock and the phase relation among the plural signals are different between monochromatic image information and color image information.

In case of such the system configuration, it is better that: an instruction of the phase difference information corresponding to the frequency of the transmission clock and the phase relation among the plural signals is given from the phase difference information transfer instructing unit 16 on the transmission side to the P to S converter 15 to perform the serial transmission, while the phase difference information is extracted from the received serial signal on the reception side and the phase correction processing is performed using the extracted phase difference information.

(Serial Transmission of Phase Difference Information)

As methods of inserting the phase difference information into the serial signal as the command data and performing the serial transmission, there are variously conceivable methods. An example of the methods will be described below.

In high-speed serial transmission of G bit/s, for example 2.5 G bit/s or more, an 8B10B encoding technology is adopted in order to serialize the parallel signal. There are also other encoding technologies than 8B10B encoding, for example, 4B5B encoding and 64B66B encoding. The 8B10B encoding technology is a system in which an 8-bit parallel signal is converted, in order to perform serial transmission, into a 10-bit serial signal so that the same level state does not continue for a long time.

In the 8B10B encoding, a special symbol referred to as a K-code is used. In the 8B10B encoding, the K-code is distinguished from information to be transmitted. Accordingly, the K-code can be used for transmission of command data (phase difference information). In the 8B10B encoding technology, in order to achieve DC-balance, 2-bit data are added to the input data of 8-bit data to generate 10-bit data having equal appearances of logics "1" and "0".

In the command inserting system using the 8B10B coding, symbols are assigned in accordance with a standard such as PCI-EXPRESS. To an idle-symbol or establishment of initial link, K28.5 is assigned; to a start of packet, K27.7 is assigned; and to an end of packet, K29.7 is assigned. Here, a packet refers to a data block having a fixed size. The command inserting system using this 8B10B encoding transmits the command data at timing another than timing of the usual data transmission portion.

Figure 4:
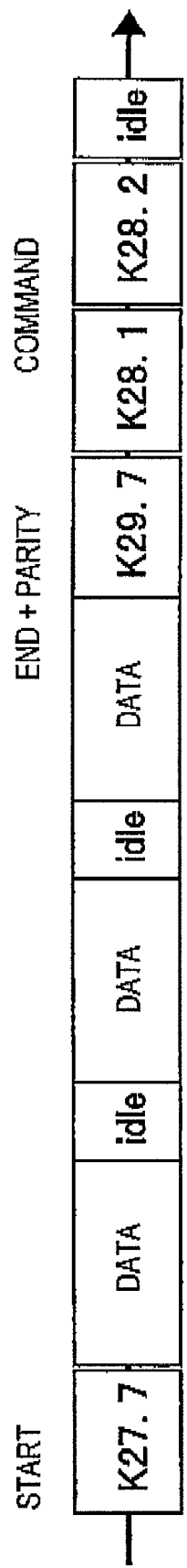
FIG. 4 is a diagram showing the command insertion structure of 8B10B encoding.

FIG. 4 shows the command insertion structure of the 8B10B encoding. In FIG. 4, K27.7 indicates a start of packet and is generated at the arbitrary packet start timing. K29.7 indicates an end of packet and is generated in accordance with a standard width. In an example shown in FIG. 4, K28.1 and K28.2 are used for commands.

Figure 5:
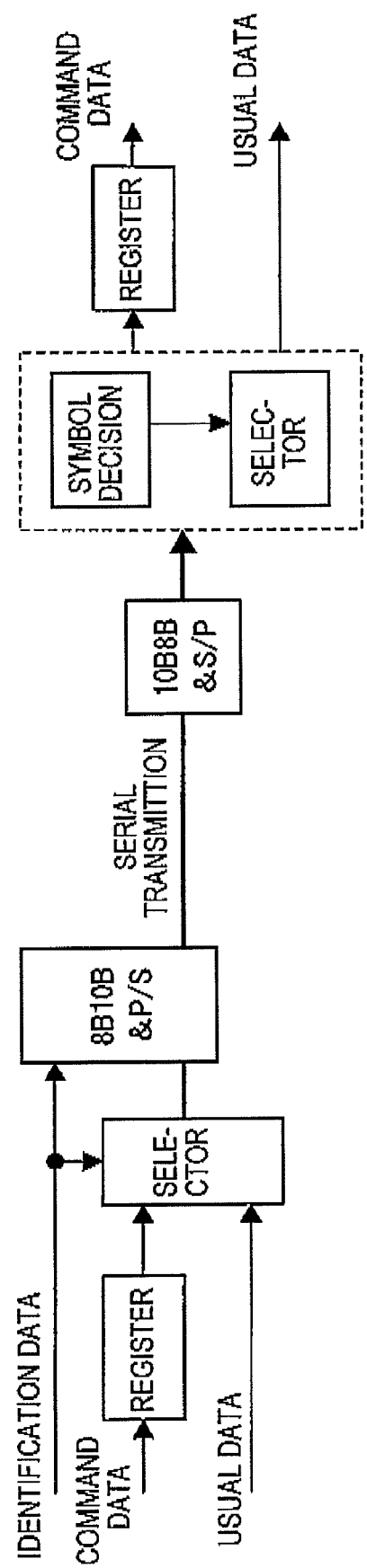
FIG. 5 is a conceptual diagram of command transmission.

FIG. 5 is a conceptual diagram of command transmission. Onto the transmission side, identification data indicating whether command data is inserted into the K-code or not is given. In case that the identification data indicates the command data insertion, the command data is selected; and in case that the identification data does indicate the command data insertion, the usual data is selected. Next, the 8B/10B conversion and parallel/serial conversion are performed thereby to perform the serial transmission. At this time, the identification data is also serially transmitted.

On the reception side, the received serial signal is subjected to the 10B8B conversion to be returned to the original 8-bit data, and to serial/parallel conversion. At this time, the above identification information is extracted and symbol decision is performed. In case that the identification data indicates the command data insertion, the command data is selected and output; and in case that the identification data does indicate the command data insertion, the usual data is selected and output. The command data selected at this time is given to the phase difference information storage unit 25 in FIG. 3 as phase difference information.

In the exemplary embodiment, although the system configuration example in which the information processing unit is composed of one CPU has been given, there is also a case that plural CPU's exist. In this case, plural groups each of which is composed of plural signals exist. As this example, there is a series transmission system which transmits image information. In case of this system, plural CPU's exist for respective colors of image information, and plural signals necessary for the image information processing exist. Among the plural groups of signals corresponding to their respective colors, the phase relation among the plural signals is different.

In this case, for each of the plural groups of signals output from the plural CPU's, a base signal is necessary, Further, phase difference information between the base signal and the other signals is necessary for each group. In this case, there are, in one series transmission system, the plural base signals and phase difference information for correcting the phases of the other signals for each of the plural base signals.

In case of this series transmission system, the phase difference information includes plural information each of which indicates the base signal for each group of plural signals output from the plural CPU's. Here, considering the case where the above-mentioned 8B10B encoding technology is used in transmission of the phase difference information, for example, K28.1 can be used for transmission of the phase difference information, and K28.2 can be used for transmission of the information indicating the base signals.

Further, in the exemplary embodiment, as an example of the serial transmission method of inserting the phase difference information, as the command data, into the series signal and performing the serial transmission, the case using the 8B10B decoding technology has been described, but this is merely an example. For example, in packet communication using a packet that is a data block having a fixed size, there are also thought a method of inserting command data into a unit of the packet to transmit the command data, and a method of providing an insertion unit between packets and inserting the command data into its insertion unit to transmit the command data.

While the invention has been described with reference to the exemplary embodiments, the technical scope of the invention is not limited to the scope described in first and second exemplary embodiments thereof, but various changes or improvements may be added to the first and second exemplary embodiments without departing from the scope of the invention. Further, exemplary embodiments to which such the changes or improvements are added are also covered in the technical scope of the invention.

Application Example

Figure 6:
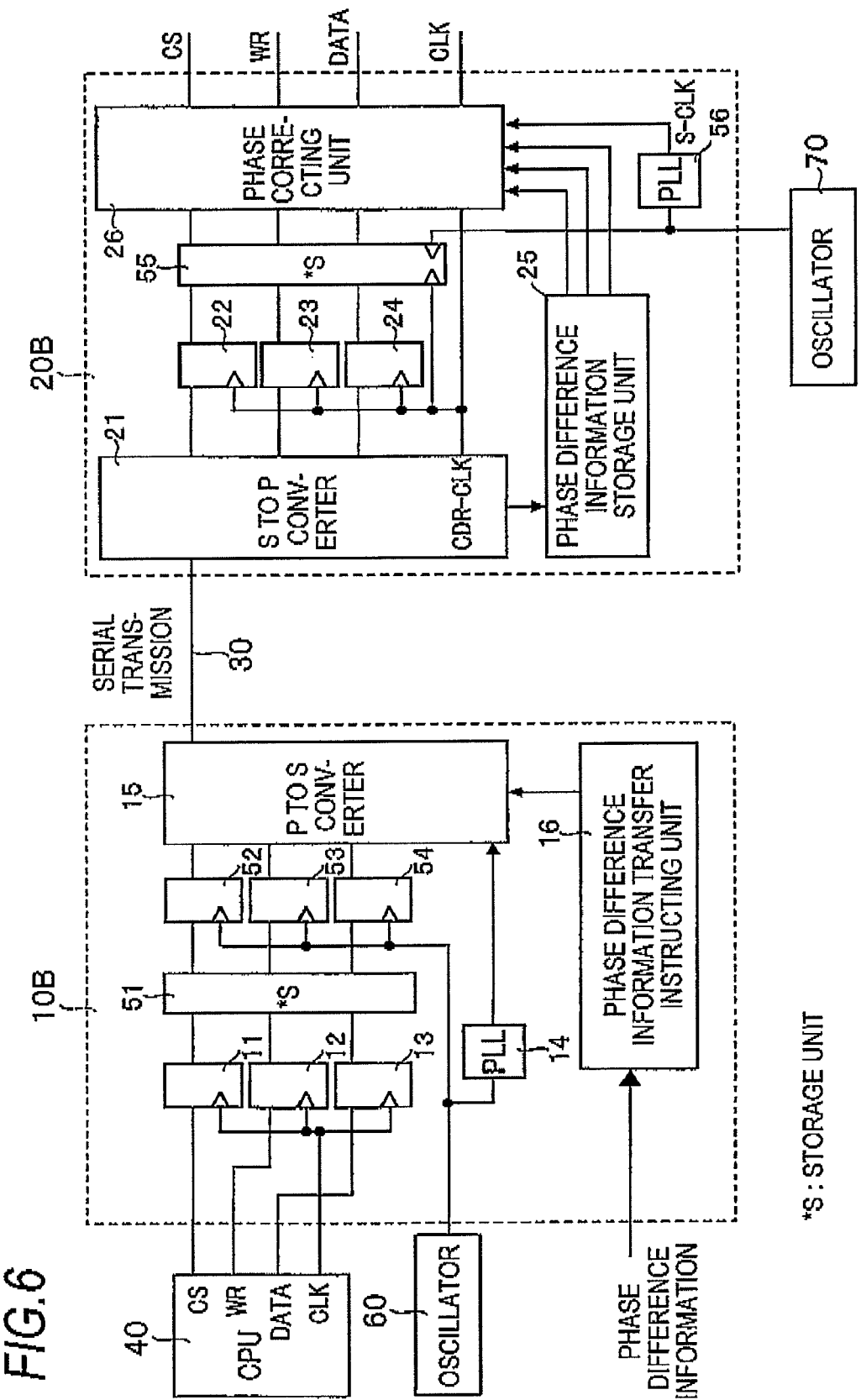
FIG. 6 is a system configuration diagram showing an outline of a configuration of a serial transmission system which transmits a signal through a storage unit in order to absorb a difference in frequency.

The invention is applicable also to a serial transmission system which, in case that the clock (sampling clock) CLK which each of the plural signals input in parallel has is extremely different in frequency from the transmission clock, transmits signals through a storage unit in order to absorb its difference in frequency. The configuration of this serial transmission system is shown in FIG. 6. In FIG. 6, units equal to those in FIG. 3 are denoted by the same symbols.

In a transmission device 10B, in a succeeding stage of latch circuits 11, 12 and 13, a storage unit 51 is provided, and latch circuits 52, 53 and 54 are provided between the storage unit 51 and a P to S converter 15. In the storage unit 51, a chip selection signal CS, a writing signal WR and an information signal DATA latched to the latch circuits 11, 12 and 13 are temporarily stored.

The chip selection signal CS, the writing signal WR and the information signal DATA stored in the storage unit 51 are latched to the latch circuits 52, 53 and 54 in synchronization with a clock clk which is supplied from an external oscillator 60 and is higher in frequency than a sampling clock CLK. The clock clk supplied from the external oscillator 60 is frequency-multiplied by a PLL circuit 14 and the frequency-multiplied clock is supplied as a transmission clock to the P to S converter 15.

Since the transmission clock is a clock obtained by frequency-multiplying the clock clk that is higher in frequency than the sampling clock CLK, the frequency of the transmission clock is greatly higher than the frequency of the sampling clock CLK. In order to absorb the difference in frequency between the transmission clock and the sampling clock CLK, the storage unit 51 is provided.

In a reception device 20B, a storage unit 55 is provided in a succeeding stage of latch circuits 22, 23 and 24. In the storage unit 55, the chip selection signal CS, the writing signal WR and the information signal DATA which are output in parallel from an S to P converter 21 are stored in synchronization with a latch clock CDR-CLK.

The chip selection signal CS, the writing signal WR and the information signal DATA stored in the storage unit 55 are input in parallel to a phase correcting unit 26 in synchronization with a clock supplied from an external oscillator 70. The clock supplied from the external oscillator 70 is frequency-multiplied by a PLL circuit 56 so as to become a clock having the same frequency as the frequency of the transmission clock, and the frequency-multiplied clock is supplied to the phase correcting unit 26.

Also in the serial transmission system having the above configuration, similarly to the serial transmission system according to the second exemplary embodiment, phase difference information is inserted, as command data, from the transmission side into a serial signal to perform serial transmission, and phase correction is performed on the reception side on the basis of the phase difference information obtained from the command data. In this example, a case in which the second exemplary embodiment is applied to the serial transmission system having the above configuration has been described, but the first exemplary embodiment may be applied thereto.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A serial signal receiving device, comprising:
a serial-parallel converter that converts a transmitted serial signal into a parallel signal, wherein the serial signal is obtained from a plurality of signals;
a storage unit that stores phase difference information indicating a phase difference among the plurality of signals; and
a correcting unit that corrects a phase relation among the plurality of signals of the parallel signal output from the serial-parallel converter based on the phase difference information stored by the storage unit,
wherein a signal of the plurality of signals, in which a logical change point comes earliest is a base signal, and wherein the phase difference information indicates a phase difference between the base signal and each of the other signals of the plurality of signals.

2. The serial signal receiving device according to claim 1, wherein the correcting unit corrects the phase difference by counting a number of periodic signals for transmitting the serial signal and correcting the phase difference based on the number of periodic signals.

3. The serial signal receiving device according to claim 1, wherein the serial signal is obtained by serializing a chip selection signal (CS), a writing signal (WR), and an information signal (DATA).

4. The serial signal receiving device according to claim 3, wherein the base signal is the chip selection signal.

5. A serial transmission system comprising:
a transmission device that converts a plurality of input signals that are input in parallel into a serial signal, and serially transmits the serial signal with phase difference information which indicates a phase difference among the plurality of input signals; and
a reception device that receives the serial signal and converts the serial signal received from the transmission device into a parallel signal, and corrects a phase relation among a plurality of signals of the parallel signal based on the phase difference information received from the transmission device.

6. The serial transmission system according to claim 5, wherein the reception device corrects the phase difference by counting the number of periodic signals for transmitting the serial signal and correcting the phrase difference using the number of periodic signals.

7. The serial transmission system according to claim 5, wherein when an encoding technology in which transmission is performed by converting a parallel signal into a serial signal having a minimum unit number that is larger than a minimum unit number of parallel signal information is used, the phase difference information is inserted into a symbol portion of the serial signal that is distinguished from information to be transmitted and is transmitted.

8. The serial signal receiving device according to claim 5, wherein a signal of the plurality of input signals, in which a logical change point comes earliest is a base signal, and wherein the phase difference information indicates a phase difference between the base signal and each of the other signals of the plurality of input signals.

9. The serial transmission system according to claim 8, wherein when a plurality of groups of the plurality of input signals exist, the phase difference information includes information indicating the base signal for each group of the plurality of groups.

10. The serial transmission system according to claim 8, wherein the serial signal is obtained by serializing a chip selection signal (CS), a writing signal (WR), and an information signal (DATA).

11. The serial transmission system according to claim 10, wherein the base signal is the chip selection signal.

12. A serial transmission method comprising:
converting a plurality of signals that are input in parallel into a serial signal;
transmitting the serial signal with phase difference information indicating a phase difference among the plurality of signals;
receiving the serial signal;
converting the serial signal into a parallel signal; and correcting a phase relation among the plurality signals of the parallel signal based on the phase difference information.

13. The serial transmission method according to claim 12, wherein a signal of the plurality of signals, in which a logical change point comes earliest is a base signal, and
wherein the phase difference information indicates a phase difference between the base signal and each of the other signals of the plurality of signals.

14. The serial transmission method according to claim 13, wherein the serial signal is obtained by serializing a chip selection signal (CS), a writing signal (WR), and an information signal (DATA).

15. The serial transmission method according to claim 14, wherein the base signal is the chip selection signal.

* * * * *